United States Patent
Stehning et al.

(10) Patent No.: US 11,199,601 B2
(45) Date of Patent: Dec. 14, 2021

(54) QUANTITATIVE MEASUREMENT OF RELAXATION TIMES IN MAGNETIC RESONANCE IMAGING

(71) Applicant: KONINKLIJKE PHILIPS N.V., Eindhoven (NL)

(72) Inventors: Christian Stehning, Hamburg (DE); Julien Senegas, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/755,894

(22) PCT Filed: Sep. 27, 2018

(86) PCT No.: PCT/EP2018/076226
§ 371 (c)(1),
(2) Date: Apr. 14, 2020

(87) PCT Pub. No.: WO2019/076599
PCT Pub. Date: Apr. 25, 2019

(65) Prior Publication Data
US 2020/0256941 A1  Aug. 13, 2020

(30) Foreign Application Priority Data
Oct. 16, 2017  (EP) .................... 17196612

(51) Int. Cl.
*G01R 33/50* (2006.01)
*G01R 33/54* (2006.01)
*G01R 33/56* (2006.01)

(52) U.S. Cl.
CPC ........... *G01R 33/50* (2013.01); *G01R 33/543* (2013.01); *G01R 33/5608* (2013.01)

(58) Field of Classification Search
USPC ......................................................... 324/309
See application file for complete search history.

(56) References Cited

U.S. PATENT DOCUMENTS 10,228,432 B2 *  3/2019  Piechnik ................ A61B 5/055
10,330,761 B2 *  6/2019  Sugiura ............ G01R 33/56308
(Continued)

OTHER PUBLICATIONS

Robson et al "Comprehensive Quantification of Signal-to-Noise Ratio and g-Factor for Image-Based and k-Space-Based Parallel Imaging Reconstructions" Magnetic Resonance in Medicine vol. 60 p. 895-907 (2008).

(Continued)

*Primary Examiner* — Rodney E Fuller (57) ABSTRACT

A magnetic resonance imaging system that includes machine executable instructions to control the system with pulse sequence commands to acquire a series of magnetic resonance data and noise magnetic resonance data. The pulse sequence commands are configured to control the system to acquire a series of magnetic resonance data from a subject according to a quantitative magnetic resonance imaging protocol for quantitatively determining a relaxation time. The quantitative magnetic resonance imaging protocol includes pulse sequence repetition having a magnetic gradient portion, a radio frequency portion, and an acquisition portion. The quantitative magnetic resonance imaging protocol includes a pause cycle between at least two of the multiple pulse sequence repetitions, wherein the pulse sequence commands are configured for acquiring noise magnetic resonance data during the pause cycle using the magnetic gradient portion and the acquisition portion.

14 Claims, 4 Drawing Sheets

(56) References Cited

U.S. PATENT DOCUMENTS

| | | | |
|---|---|---|---|
| 10,575,771 B2* | 3/2020 | Banerjee | G01R 33/50 |
| 2008/0310695 A1 | 12/2008 | Garnier et al. | |
| 2011/0181285 A1 | 7/2011 | Greiser | |
| 2012/0271147 A1 | 10/2012 | Kim et al. | |
| 2015/0099964 A1 | 4/2015 | Voigt et al. | |
| 2016/0018498 A1 | 1/2016 | Boernert et al. | |
| 2016/0084929 A1 | 3/2016 | Dale et al. | |

OTHER PUBLICATIONS

International Search Report and Written Opinion from PCT/EP2018/076226 dated Dec. 13, 2018.

C. Preibisch et al: "T1 mapping using spoiled FLASH-EPI hybrid sequences and varying flip angles", Magnetic Res0nance in Medicine. ,vol. 62, No. 1, Jul. 1, 2009 (Jul. 1, 2009),pp. 240-246.

Oros-Peusquens A M EI AL: "Methods for Molecular imaging of brain tumours in a hybrid MR-PET context: Water content, T2,diffusion indices and FET-PET",Methods,vol. 13 0, Aug. 1, 2017 (Aug. 1, 2017), pp. 135-151.

Aja-Fernandez S et al: "Noise estimation in single- and multiple-coil magnetic resonance data based on statistical models". Magnetic Resonance Imaging, Elsevier Science, Tarryt0wn, NY, US,vol. 27, No. 10,Dec. 1, 2009 (Dec. 1, 2009), pp. 1397-1409.

Martijn Fr0eling et al: "MASSIVE:Multiple Acquisitions for Standardization of Structural Imaging Validation and Evaluation", Proceedings of the International Society for Magnetic Resonance in Medicine, ISMRM, Joint Annual Meeting ISMRM-ESMRMB, Milan, Italy, May 10-16, 2014, No. 2582 , Apr. 25, 2014 (Apr. 25, 2014), p. 2582.

Karslsen et al "Parameter Estimation from Rician-distributed Data Sets using a Maximum Likelihood Estimator . . . " Magn. Reson. Med. 41 p. 614-623 (1999).

* cited by examiner

QUANTITATIVE MEASUREMENT OF RELAXATION TIMES IN MAGNETIC RESONANCE IMAGING

CROSS REFERENCE TO RELATED APPLICATIONS

This application is a U.S. national phase application of International Application No. PCT/EP2018/076226 filed on Sep. 27, 2018, which claims the benefit of EP Application Serial No. 17196612.0 filed on Oct. 16, 2017 and is incorporated herein by reference.

TECHNICAL FIELD OF THE INVENTION

The invention relates to Magnetic Resonance Imaging, in particular to the quantitative measurement of relaxation times.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI. For example various electrical properties of a subject can be investigated using MRI. Several quantities which may be measured quantitatively measured are the relaxation times related to the decay of a Nuclear Magnetic Resonance (NMR) signal. These relaxation times are collectively referred to as "relaxation times" herein.

The relaxation times include the longitudinal (or spin-lattice) relaxation time, which is also known as the spin-lattice relaxation time or T1 relaxation time. The relaxation times also include the transverse relaxation time, which is also known as the spin-spin relaxation time or T2 relaxation time. The T2* relaxation time or T2-star relaxation time is also considered to be a relaxation time herein and is due to a dephasing of the NMR single due to inhomogeneities of the B0 field due to the presence of molecules in the sample being examined.

United States patent application 2012/0271147 A1 discloses exemplary systems, methods and computer-accessible mediums can be provided for imaging at least one anatomical structure. For example, it is possible to direct a saturation-recovery (SR) pulse sequence having Fast Spin Echo (FSE) to or at the anatomical structure(s). At least one T1 image of the at least one anatomical structure can be generated based on the SR pulse sequence. In one example, the anatomical structure(s) can include a hip. According to another example, T1 image(s) can include a plurality of T1 images generated or provided in a plurality of rotating radial planes. This application further discloses the acquisition of a noise map using, for example, a pulse sequence without RF excitation.

The journal article Karlsen, O. T., Verhagen, R. and Bovée, W. M. M. J. (1999), Parameter estimation from Rician-distributed data sets using a maximum likelihood estimator: Application to t1 and perfusion measurements. Magn. Reson. Med., 41: 614-623. doi:10.1002/(SICI)1522-2594(199903)41:3<614: AID-MRM26>3.0.CO; 2-1 discloses the estimation of T1 relaxation times using a maximum likelihood estimator.

SUMMARY OF THE INVENTION

The invention provides for a magnetic resonance imaging system, a computer program product and a method in the independent claims.

In the measurement of relaxation times, a number of repeated measurements are made using multiple pulse sequence repetitions. During each of these pulse sequence repetitions the magnetic resonance data is acquired. The magnetic resonance data from each of the pulse sequence repetitions may be reconstructed into an image. The repeated acquisition of the magnetic resonance data results in a series of magnetic resonance data that can be reconstructed into a series of magnetic resonance images. The analysis of the series of magnetic resonance images allows the calculation of the relaxation times or other quantities which are derived from or related to the relaxation times, such as the concentration of magnetic resonance imaging contrast agents.

A knowledge of the noise during that is present in the series of the magnetic resonance images may allow a better estimation of the relaxation times or quantities derived from the relaxation times. The noise in the series of the magnetic resonance images is dependent upon the acquisition conditions and the settings of the magnetic resonance imaging system during acquisition. The noise also varies spatially within the series of the magnetic resonance images. To make an accurate estimate of the noise, embodiments may use the same pulse sequence repetition as was used to acquire the series of magnetic resonance data with the RF portion (portion of the pulse sequence for controlling the generation of RF pulses) of the pulse sequence repetition disabled. This acquisition is referred to as an acquisition of noise magnetic resonance data herein. The configuration of the magnetic resonance imaging system is therefore the same and the noise measurement will be accurate.

Acquiring the noise magnetic resonance data can however delay the magnetic resonance imaging protocol. However, during the execution of pulse sequence instructions for a quantitative magnetic resonance imaging protocol there are periods or pause cycles wherein there are delays between some of the pulse sequence repetitions. Embodiments may acquire the noise magnetic resonance data during the pause cycle. Because the RF portion has been disabled the acquisition of the noise magnetic resonance data does not affect the magnetization of the sample or subject being measured. The technical effect is that the magnetic resonance imaging protocol is accelerate because the noise magnetic resonance data is measured during an otherwise unused interval of time. The quality of the noise measurement may also be better because it is measured during the actual acquisition and not before or after. This ensures that the noise magnetic resonance data is acquired under the same conditions as the series of magnetic resonance data.

In one aspect, the invention provides for a magnetic resonance imaging system that comprises a memory for storing machine-executable instructions and pulse sequence commands. The pulse sequence commands are configured for controlling the magnetic resonance imaging system to acquire a series of magnetic resonance data from a subject according to a quantitative magnetic resonance imaging protocol for quantitatively determining a relaxation time. The quantitative magnetic resonance imaging protocol is configured for controlling the magnetic resonance imaging system to acquire the series of magnetic resonance data using multiple pulse sequence repetitions. Each of the multiple pulse sequence repetitions comprises a magnetic gradient portion, a radio-frequency portion, and an acquisition portion. The magnetic gradient portion as used herein encompasses commands which are used to control a magnetic field gradient system of the magnetic resonance imaging system. This may include for example a coil for generating gradient fields and a power supply for supplying current to these gradient coils. The radio-frequency portion may comprise a portion of the pulse sequence which best supplies a radio-frequency pulse that is generated during the pulse sequence commands. The acquisition portion may comprise instructions which control the pulse sequence commands to acquire data from a magnetic resonance imaging coil during the execution of the pulse sequence commands.

The quantitative magnetic resonance imaging protocol comprises a pause cycle between at least two of the multiple pulse sequence repetitions. The pulse sequence commands are configured for acquiring noise magnetic resonance data during the pause cycle using the magnetic gradient portion and the acquisition portion. The radio-frequency portion is disabled during the acquisition of the noise magnetic resonance data. During the acquisition of the noise magnetic resonance data essentially the same pulse sequence commands are used but with the RF portion disabled. This has the effect of acquiring the noise for the particular amplifier and other settings that are being used by the magnetic resonance imaging system but the radio-frequency portion does not interfere with any of the relaxation times being measured.

The magnetic resonance imaging system further comprises a processor for controlling the magnetic resonance imaging system. Execution of the machine-executable instructions further cause the processor to control the magnetic resonance imaging system with the pulse sequence commands to acquire the series of magnetic resonance data and the noise magnetic resonance data. Execution of the machine-executable instructions further cause the processor to reconstruct a series of magnetic resonance images weighted for the relaxation time using the series of magnetic resonance data. Execution of the machine-executable instructions further cause the processor to reconstruct a noise magnetic resonance image using the noise magnetic resonance data.

This embodiment may be beneficial because it produces a series of magnetic resonance images weighted for a particular relaxation time that may be used for calculating a relaxation time or even quantities dependent upon the relaxation time such as a concentration of a contrast agent. The noise magnetic resonance image may be used to produce a noise figure or noise data which is descriptive of the amount of noise within each of the series of the magnetic resonance images.

As used herein a series of magnetic resonance images is understood to be data which may or may not be rendered as images. Likewise the noise magnetic resonance image also comprises data in image space which may or may not be rendered. The series of magnetic resonance images and the noise magnetic resonance image may be used in further computations or calculations instead of rendering them.

In another embodiment, execution of the machine-executable instructions further cause the processor to calculate a spatially dependent noise map by spatially averaging the noise magnetic resonance image. Each voxel of the noise magnetic resonance image comprises a value or data which is essentially noise. By spatially averaging the noise magnetic resonance image it is possible to create an estimate of the amount of noise in each voxel.

In another embodiment, the spatially dependent noise map is calculated by averaging over a kernel of voxels. This embodiment may be beneficial because it may provide for an efficient means of calculating the spatially dependent noise map in a consistent fashion. In some examples, the kernel could for example be square or rectangular in shape, however the shape of the kernel is not limiting.

In another embodiment, the kernel of voxels comprises any one of the following: between 50 and 100 voxels, between 101 and 400 voxels, between 401 and 900 voxels, between 901 and 1600 voxels.

In another embodiment, the spatially dependent noise map is further calculated by smoothing the spatially dependent noise map. In some examples the spatially dependent noise map may first be calculated by averaging and then smoothing the data. In other examples the averaging and the smoothing can be calculated at the same time. For example so called exponential averaging may be used when calculating the spatially dependent noise map by averaging over a square kernel. For example an exponential or other function could be used to calculate the effect of a voxel in an average. The further away from a voxel is it will be less effective in the average value.

In another embodiment, execution of the machine-executable instructions further cause the processor to calculate a spatially dependent relaxation time map and a spatially dependent error map using the spatially dependent noise map and the series of magnetic resonance images. The spatially dependent error map is a mapping of the likely error of the spatially dependent map. This may be beneficial because not only is the spatially dependent relaxation time map calculated but it is also an estimate of how great the error for each of these voxels may be. This may be beneficial when using the spatially dependent relaxation time map for performing such things as a diagnostic or other measurements.

In another embodiment, the spatially dependent relaxation time map and the spatially dependent error map are calculated using a maximum likelihood estimator. This embodiment may be beneficial because the use of a maximum likelihood estimator provides an improved calculation of the relaxation time map using the time series of the magnetic resonance images and the spatially dependent noise map.

In another embodiment, execution of the machine-executable instructions further cause the processor to display the spatially dependent relaxation time map and a spatially dependent error map on a display. This may be useful to display both simultaneously so that the relaxation time map can be given an estimate of how accurate it is. In some instances the two maps may be overlaid on each other.

In another embodiment, the relaxation time is a T1 relaxation time.

In another embodiment, execution of the machine-executable instructions further cause the processor to calculate a concentration of a contrast agent using the spatially dependent relaxation time map.

In another embodiment, the magnetic resonance imaging protocol is an MOLLI magnetic resonance imaging protocol. This embodiment may be beneficial because it may provide for a means of performing T1 cardiac mapping. MOLLI stands for modified look-locker imaging.

In another embodiment, the relaxation time is a T2 relaxation time. This embodiment may be beneficial because such data could for example be useful in the diagnosis of an acute coronary syndrome. This for example could be implemented by having the pulse sequence commands use a T2 weighted turbo spin-echo sequence with long repetition times and echo times and could be preceded by an inversion module to suppress blood. In another example the pulse sequence commands could be a T2 weighted steady-state free precession sequence. In another example the pulse sequence commands are a combination of the T2 weighted steady-state free precession sequence and the above mentioned turbo spin-echo sequences.

In another embodiment, the relaxation time is a T2* relaxation time. This embodiment may be beneficial for use for a T2 mapping for example for assessment of iron deposition in the heart and the liver. In this embodiment, the pulse sequence commands may be a multiple echo GRE sequence. The T2* value may for example be calculated by looking at a first order exponential decay curve.

In another aspect, the invention provides for a computer program product comprising machine-executable instructions for execution by a processor controlling a magnetic resonance imaging system. Execution of the machine-executable instructions cause the processor to control the magnetic resonance imaging system with pulse sequence commands to acquire a series of magnetic resonance data and noise magnetic resonance data. The pulse sequence commands are configured for controlling the magnetic resonance imaging system to acquire a series of magnetic resonance data form a subject according to a quantitative magnetic resonance imaging protocol for quantitatively determining a relaxation time. The quantitative magnetic resonance imaging protocol is configured for acquiring the series of the magnetic resonance data using multiple pulse sequence repetitions. Each of the multiple pulse sequence repetitions comprises a magnetic gradient portion, a radio-frequency portion, and an acquisition portion.

The quantitative magnetic resonance imaging protocol comprises a pause cycle between at least two of the multiple pulse sequence repetitions. The pulse sequence commands are configured for acquiring the noise magnetic resonance data during the pause cycle using the magnetic gradient portion and the acquisition portion. The radio-frequency portion is disabled during the acquisition of the noise magnetic resonance data. Execution of the machine-executable instructions further causes the processor to reconstruct a series of magnetic resonance images weighted for the relaxation time using a series of magnetic resonance data. Execution of the machine-executable instructions further cause the processor to reconstruct a noise magnetic resonance image using the noise magnetic resonance data.

In another aspect, the invention provides for a method of operating a magnetic resonance imaging system. The method comprises controlling the magnetic resonance imaging system with pulse sequence commands to acquire a series of magnetic resonance data and noise magnetic resonance data. The pulse sequence commands are configured for controlling the magnetic resonance imaging system to acquire the series of magnetic resonance data from a subject according to a quantitative magnetic resonance imaging protocol for quantitatively determining a relaxation time.

The quantitative magnetic resonance imaging protocol is configured for acquiring the series of magnetic resonance data using multiple pulse sequence repetitions. Each of the multiple pulse sequence repetitions comprises a magnetic gradient portion, a radio-frequency portion, and an acquisition portion. The quantitative magnetic resonance imaging protocol comprises a pause cycle between at least two of the multiple pulse sequence repetitions. The pulse sequence commands are configured for acquiring noise magnetic resonance data during the pause cycle using the magnetic gradient portion and the acquisition portion. The radio-frequency portion is disabled during the acquisition of the noise magnetic resonance data. The method further comprises reconstructing a series of magnetic resonance images weighted for the relaxation time using the series of magnetic resonance data. The method further comprises reconstructing a noise magnetic resonance image using the noise magnetic resonance data.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor.

'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. MRF magnetic resonance data is magnetic resonance data.

Magnetic resonance data is an example of medical image data. A Magnetic Resonance Imaging (MRI) image or MR image is defined herein as being the reconstructed two or three dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
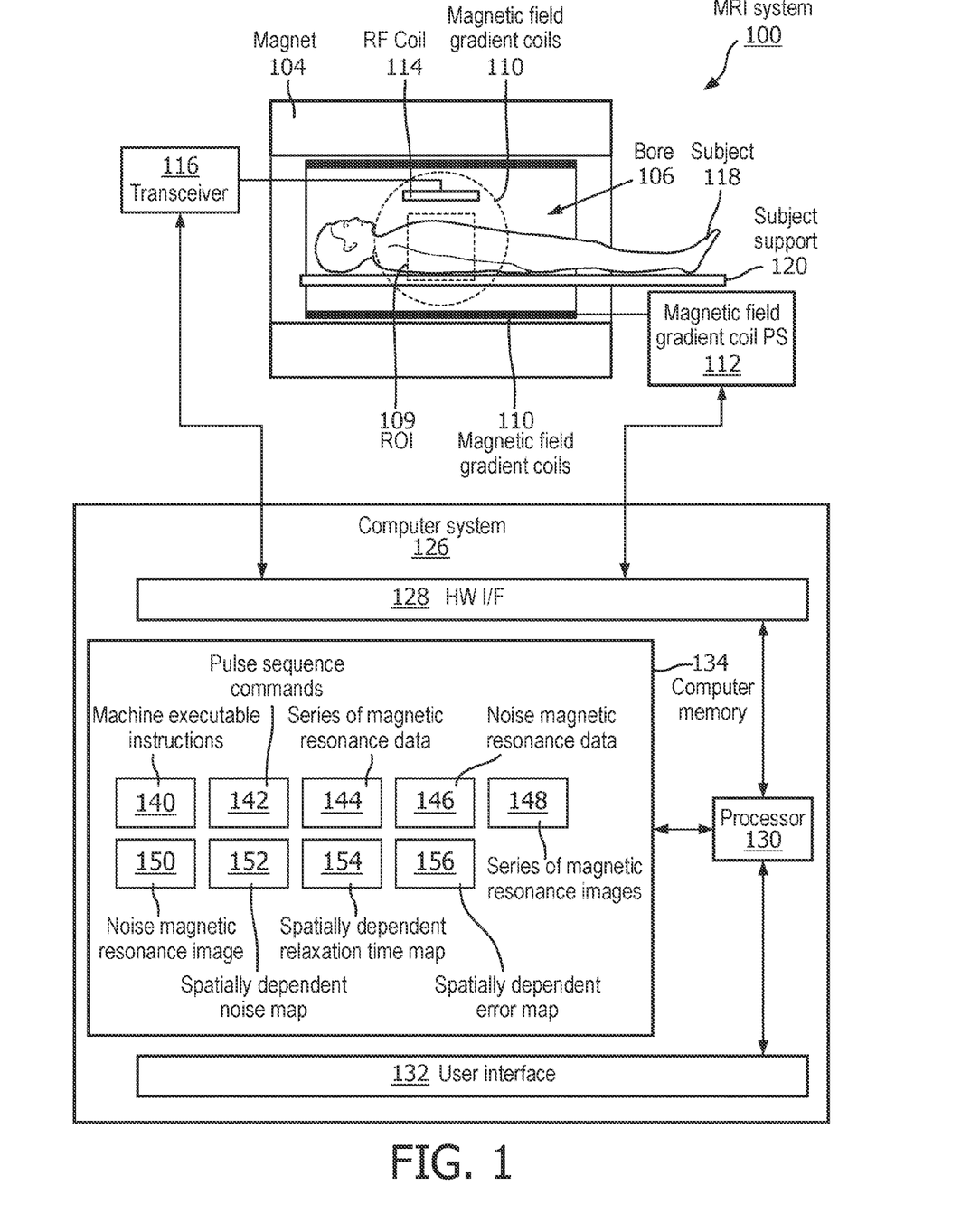
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance data that is acquired typically acquired for the region of interest. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

In this example the subject, 118 is positioned such that the subject's head region is within the region of interest 109. In other examples, other parts of the subject's 118 body may be positioned in the region of interest 109.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium.

The memory 134 is shown as containing machine-executable instructions 140. The machine-executable instructions 140 enable the processor 130 to control the operation and function of the magnetic resonance imaging system 100. The machine-executable instructions 140 may also enable the processor 130 to perform various data analysis and calculation functions. The computer memory 134 is further shown as containing pulse sequence commands 142. The pulse sequence commands are configured for controlling the magnetic resonance imaging system 100 to acquire a series of magnetic resonance data from the subject 118 according to a quantitative magnetic resonance imaging protocol for quantitatively determining a relaxation time. The quantitative magnetic resonance imaging protocol is configured for controlling the magnetic resonance imaging system to acquire the series of magnetic resonance data 144 using multiple pulse sequence repetitions. Each of the multiple pulse sequence repetitions comprise a magnetic gradient portion, a radio-frequency portion, and an acquisition portion. The quantitative magnetic resonance imaging protocol further comprises a pause cycle between at least two of the multiple pulse sequence repetitions. The pulse sequence commands are configured for acquiring noise magnetic resonance data 146 during the pause cycle using the magnetic gradient portion and the acquisition portion. The radio-frequency portion is disabled during the acquisition of the noise magnetic resonance data 146.

The memory 134 is further shown as containing both the series of magnetic resonance data 144 and the noise magnetic resonance data 146 that was acquired by controlling the magnetic resonance imaging system 100 with the pulse sequence commands 142. The memory is further shown as containing a series of magnetic resonance images 148 that were reconstructed from the series of magnetic resonance data 144. The memory 134 is further shown as containing a noise magnetic resonance image 150 that was constructed from the noise magnetic resonance data 146. The computer memory 134 is further shown as containing a spatially dependent noise map 152 that was calculated using the noise magnetic resonance image 150. The computer memory 134 is further shown as containing a spatially dependent relaxation time map 154 and a spatially dependent error map 156 that were calculated using the series of magnetic resonance images 148 and the spatially dependent noise map 152. The spatially dependent noise map 152, the spatially dependent relaxation time map 154, and the spatially dependent error map 156 may not necessarily be present in all examples.

Figure 2:
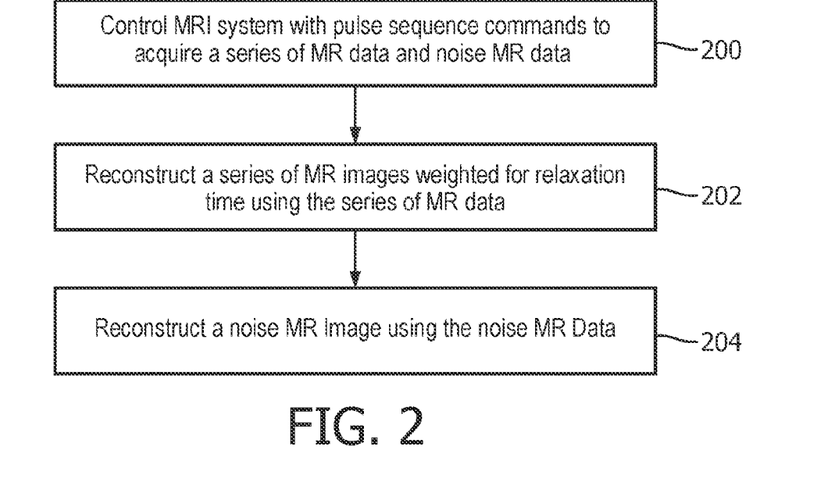
FIG. 2 shows a flow chart which illustrates a method of operating a magnetic resonance imaging system such as is illustrated in FIGS. 1 and 4.

FIG. 2 shows a flowchart which illustrates a method of operating the magnetic resonance imaging system 100 of FIG. 1. First in step 200 the magnetic resonance imaging system 100 is controlled with the pulse sequence commands 142 to acquire the series of magnetic resonance data 144 and also to acquire the noise magnetic resonance data 146. Next in step 202 the series of magnetic resonance images 148 is reconstructed from the series of magnetic resonance data 144. Then in step 204, the noise magnetic resonance image 150 is reconstructed using the noise magnetic resonance data 146.

Figure 3:
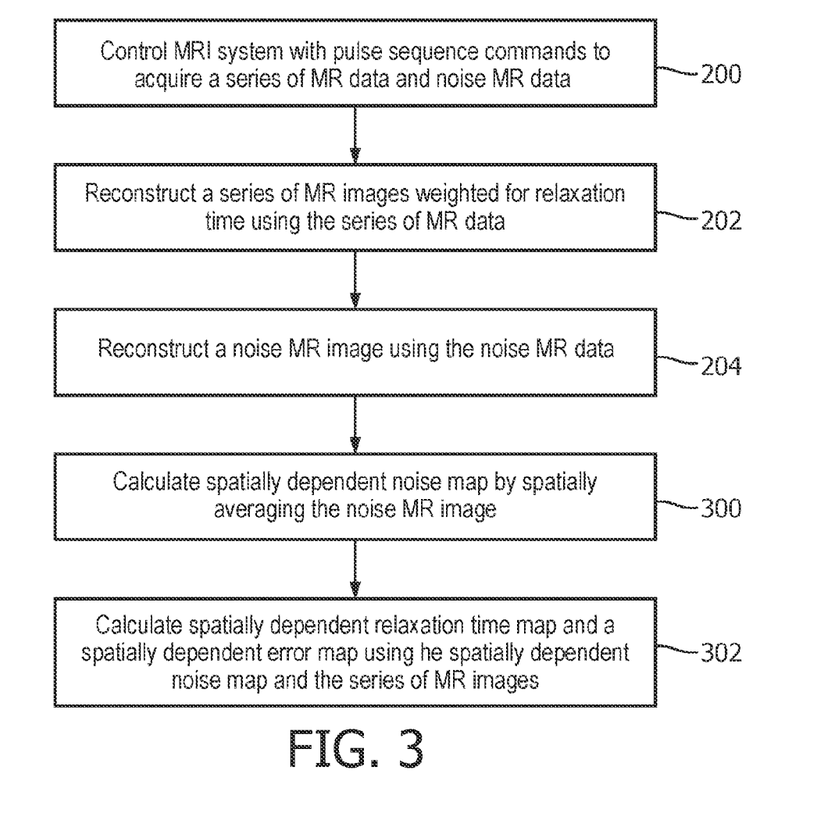
FIG. 3 shows a flow chart which illustrates a further method of operating a magnetic resonance imaging system such as is illustrated in FIGS. 1 and 4.

FIG. 3 shows a flowchart which illustrates a further method of using the magnetic resonance imaging system 100 in FIG. 1. The method in FIG. 3 is similar to the method in FIG. 2. The method in FIG. 3 starts with steps 200, 202, and 204 as were performed in FIG. 2. After step 204 step 300 is performed. In step 300 the spatially dependent noise map 152 is calculated by spatially averaging the noise magnetic resonance image 150. Then in step 302, the spatially dependent relaxation time map 302 and the spatially dependent error map 156 are calculated using the series of magnetic resonance images 148 and the spatially dependent noise map 152. This for example may be performed using a maximum likelihood estimator.

Figure 4:
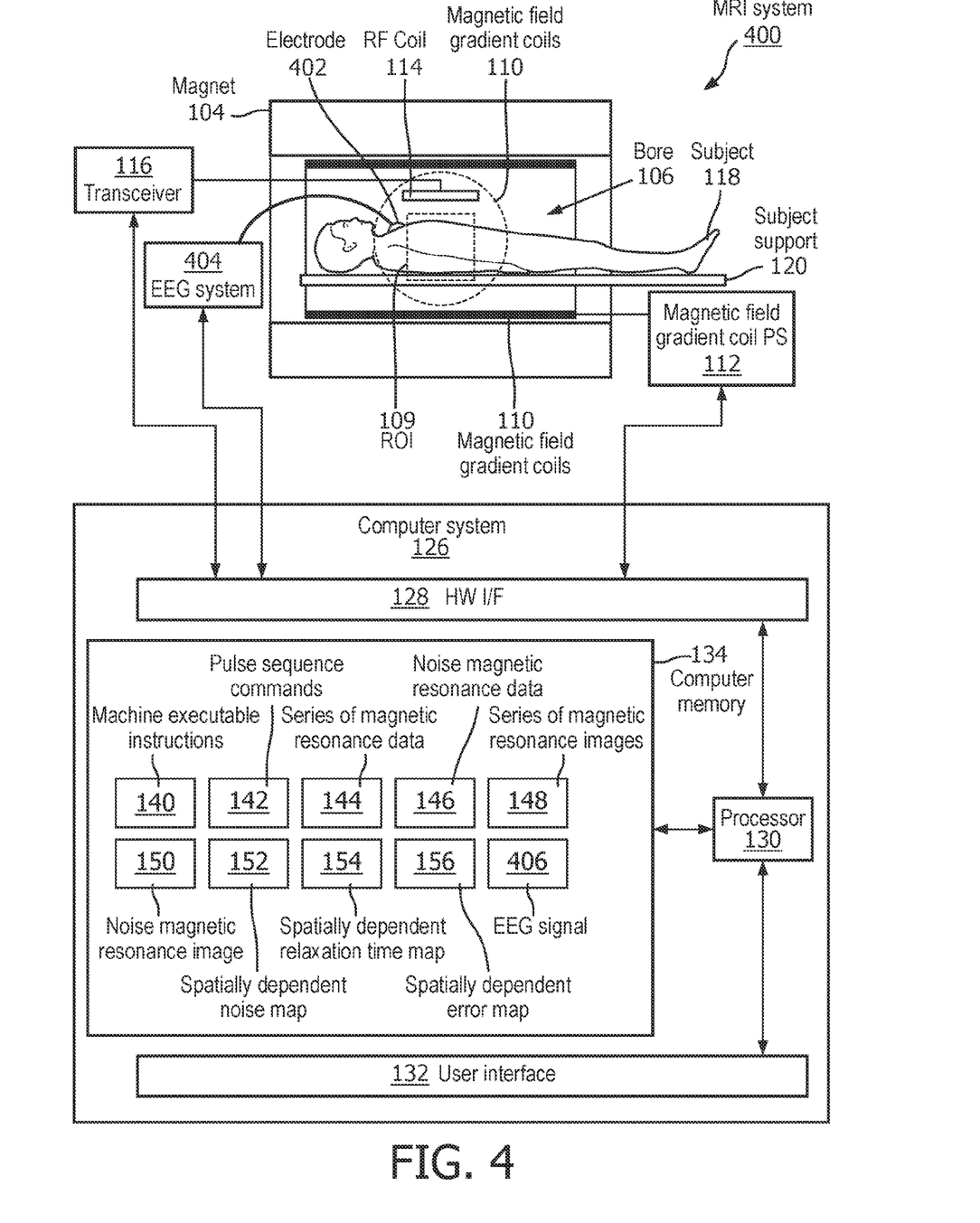
FIG. 4 illustrates a further example of a magnetic resonance imaging system.

FIG. 4 illustrates a further example of a magnetic resonance imaging system 400. The magnetic resonance imaging system 400 in FIG. 4 is similar to the magnetic resonance imaging system 100 in FIG. 1. Both methods of FIGS. 2 and 3 may also be used to control the magnetic resonance imaging system 400 of FIG. 4.

In the magnetic resonance imaging system 400 of FIG. 4 the pulse sequence commands 142 are configured for performing a MOLLI magnetic resonance imaging protocol. The relaxation time is the T1 relaxation time. The series of magnetic resonance images are weighted for the T1 relaxation time. The subject 118 is further shown as having an electrode 402 on the subject's 118 thorax. The electrode 402 is connected to an EEG system 404. The EEG system 404 is shown as being further connected to the hardware interface 128. The memory 134 is further shown as containing an EEG signal 406 that was received from the EEG system 404. In the MOLLI magnetic resonance imaging protocol, the EEG signal is used to trigger individual acquisitions of the series of magnetic resonance data. This synchronizes all portions of the series of magnetic resonance data to a particular phase of the subject's 118 heart.

Examples may provide for a method to derive confidence information, e.g. the expected standard deviation or confidence interval, along with the reconstructed values in a quantitative map (T1, T2). For this purpose, a noise scan with identical imaging parameters is incorporated without a scan time penalty by evaluating the data of previously unused "pause cycles".

Quantitative MR techniques (T1, T2 mapping) are increasingly popular in clinical practice, as they allow for a quantitative assessment of vital tissue properties, and allow discriminating between health and disease. However, a quantitative assessment of the expected standard deviation, or confidence intervals, is needed to rate the statistical significance of the observed results.

Most quantitative methods do not provide a direct measure of the expected parameter variations, e.g. due to noise. Examples may enable derivation this information from inline noise scans, which can be acquired without a scan time penalty.

Most quantitative MR techniques require "pause" periods with no RF radiation, i.e. to allow for magnetization recovery (T1 mapping) or inflow of unsaturated spins (blackblood T2 mapping). The key element of the invention is to use these pause periods to acquire pure noise images without using RF pulses. These acquisitions do not perturb the free magnetization recovery, and provide noise information that can be used to derive the expected standard deviation of the actual parameter measurement.

Figure 5:
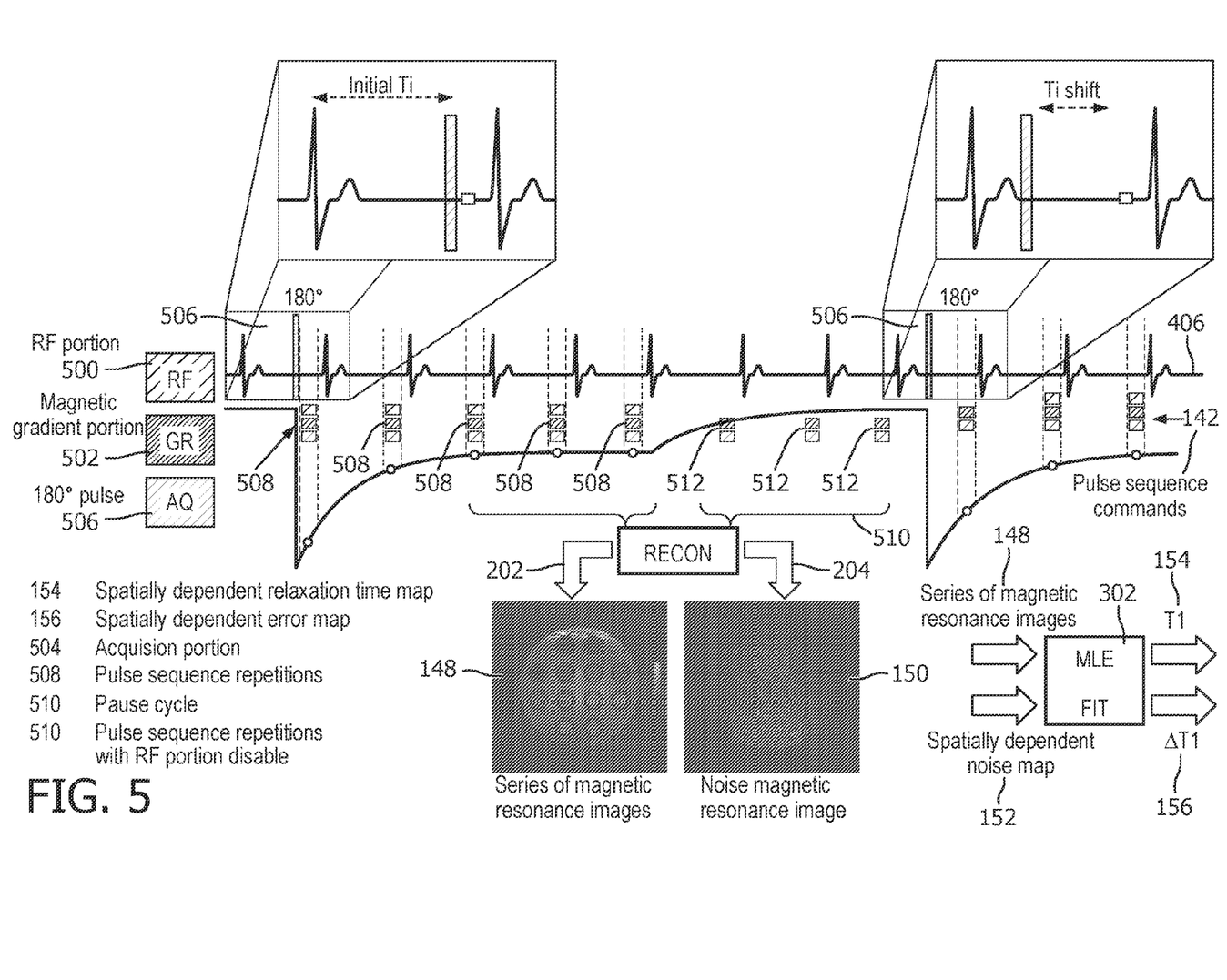
FIG. 5 graphically illustrates a method of operating the magnetic resonance imaging system of FIG. 4.

A possible implementation of an example for the invention for cardiac T1 mapping is sketched in FIG. 5. FIG. 5 illustrates graphically the pulse sequence commands and acquisition method for the MOLLI pulse sequence commands 142 for FIG. 4. In this Fig. there is a timing diagram which illustrates an EEG signal 406. The blocks 500, 502, and 506 represent the RF portion 500 of the pulse sequence, the magnetic gradient portion 502 of the pulse sequence, and the acquisition portion 504 of the pulse sequence. In the portion labeled 142 the RF portion 500 is above the magnetic gradient portion 502. The magnetic gradient portion 502 is above the acquisition portion 504. The pulse sequences are shown as starting with a 180° RF pulse 506. After this, there are multiple pulse sequence repetitions 508 that are performed.

There are also a number of pulse sequence repetitions with the RF portion 500 disabled that are performed during a pause cycle 510. The pulse sequence repetitions 508 are used to acquire the series of magnetic resonance data and the pulse sequence repetitions with the RF portion 500 disabled are used to acquire the noise magnetic resonance data 146. The series of magnetic resonance data is used to reconstruct a series of magnetic resonance images 148. The noise magnetic resonance data 146 is used to reconstruct a noise magnetic resonance image 150. The noise magnetic resonance image 150 is used to reconstruct the spatially dependent noise map 152. The series of magnetic resonance images 148 and the spatially dependent noise map 152 are used as input to a maximum likelihood estimator to calculate 302 a spatially dependent relaxation time map 154 and a spatially dependent error map 156.

FIG. 5 illustrates cardiac T1 mapping with an inline noise scan. There are three "empty" RR intervals (pause cycle) (510, 512) which allow for magnetization recovery prior to reinversion (506). During these intervals, noise data are acquired using gradients and signal sampling (no RF). The noise images are reconstructed using the same reconstruction as for the actual images. The noise data are propagated to the fitting algorithm to derive the expected parameter standard deviation (ΔT1).

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer memory
140 machine executable instructions
142 pulse sequence commands
144 series of magnetic resonance data
146 noise magnetic resonance data
148 series of magnetic resonance images
150 noise magnetic resonance image
152 spatially dependent noise map
154 spatially dependent relaxation time map
156 spatially dependent error map
200 control the magnetic resonance imaging system with the pulse sequence commands to acquire the series of magnetic resonance data and the noise magnetic resonance data
202 reconstruct a series of magnetic resonance images weighted for the relaxation time using the series of magnetic resonance data
204 reconstruct a noise magnetic resonance image using the noise magnetic resonance data
300 calculate a spatially dependent noise map by spatially averaging the noise magnetic resonance image
302 calculate a spatially dependent relaxation time map and a spatially dependent error map using the spatially dependent noise map and the series of magnetic resonance images
400 magnetic resonance imaging system
402 electrode
404 EEG system
406 EEG signal
500 RF portion
502 magnetic gradient portion
504 acquisition portion
506 180° pulse
508 pulse sequence repetitions
510 pause cycle
510 pulse sequence repetitions with RF portion disabled

The invention claimed is:

1. A magnetic resonance imaging system comprising:
a memory for storing machine executable instructions and pulse sequence commands, wherein the pulse sequence commands are configured for controlling the magnetic resonance imaging system to acquire a series of magnetic resonance data from a subject according to a quantitative magnetic resonance imaging protocol for quantitatively determining a relaxation time, wherein the quantitative magnetic resonance imaging protocol is configured for controlling the magnetic resonance imaging system to acquire the series of the magnetic resonance data using multiple pulse sequence repetitions, wherein each of the multiple pulse sequence repetitions comprises a magnetic gradient portion, a radio frequency portion, and an acquisition portion, wherein the quantitative magnetic resonance imaging protocol comprises a pause cycle between at least two of the multiple pulse sequence repetitions, wherein the pulse sequence commands are configured for acquiring noise magnetic resonance data during the pause cycle using the magnetic gradient portion and the acquisition portion, wherein the radio frequency portion is disabled during the acquisition of the noise magnetic resonance data;
a processor for controlling the magnetic resonance imaging system, wherein execution of the machine executable instructions further cause the processor to:
control the magnetic resonance imaging system with the pulse sequence commands to acquire the series of magnetic resonance data and the noise magnetic resonance data;
reconstruct a series of magnetic resonance images weighted for the relaxation time using the series of magnetic resonance data; and
reconstruct a noise magnetic resonance image using the noise magnetic resonance data.

2. The magnetic resonance image of claim 1, wherein execution of the machine executable instructions further causes the processor to calculate a spatially dependent noise map by spatially averaging the noise magnetic resonance image.

3. The magnetic resonance imaging system of claim 2, wherein the spatially dependent noise map is calculated by averaging over a kernel of voxels.

4. The magnetic resonance imaging system of claim 3, wherein the kernel of voxels comprises any one of the following: between 50 and 100 voxels, between 101 and 400 voxels, between 401 and 900 voxels, and between 901 and 1600 voxels.

5. The magnetic resonance imaging system of claim 2, wherein the spatially dependent noise map is further calculated by smoothing the spatially dependent noise map.

6. The magnetic resonance imaging system of claim 2, wherein execution of the machine executable instructions further causes the processor to calculate a spatially dependent relaxation time map and a spatially dependent error map using the spatially dependent noise map and the series of magnetic resonance images, and wherein the spatially dependent error map is a mapping of the likely error of the spatially dependent map.

7. The magnetic resonance imaging system of claim 6, wherein the spatially dependent relaxation time map and the spatially dependent error map are calculated using a maximum likelihood estimator.

8. The magnetic resonance imaging system of claim 6, wherein execution of the machine executable instructions further cause the processor to display the spatially dependent relaxation time map and a spatially dependent error map on a display.

9. The magnetic resonance imaging system of claim 1, wherein the relaxation time is a T1 relaxation time.

10. The magnetic resonance imaging protocol of claim 9, wherein the magnetic resonance imaging protocol is a modified look-locker imaging (MOLLI) magnetic resonance imaging protocol.

11. The magnetic resonance imaging system of claim 1, wherein the relaxation time is a T2 relaxation time.

12. The magnetic resonance imaging system of claim 1, wherein the relaxation time is a T2* relaxation time.

13. A computer program product comprising machine executable instructions stored on a non-transitory computer readable medium for execution by a processor controlling a magnetic resonance imaging system, execution of the machine executable instructions causes the processor to:
control the magnetic resonance imaging system with pulse sequence commands to acquire a series of magnetic resonance data and noise magnetic resonance data, wherein the pulse sequence commands are configured for controlling the magnetic resonance imaging system to acquire the series of magnetic resonance data from a subject according to a quantitative magnetic resonance imaging protocol for quantitatively determining a relaxation time, wherein the quantitative magnetic resonance imaging protocol is configured for acquiring the series of the magnetic resonance data using multiple pulse sequence repetitions, wherein each of the multiple pulse sequence repetitions comprises a magnetic gradient portion, a radio frequency portion, and an acquisition portion, wherein the quantitative magnetic resonance imaging protocol comprises a pause cycle between at least two of the multiple pulse sequence repetitions, wherein the pulse sequence commands are configured for acquiring noise magnetic resonance data during the pause cycle using the magnetic gradient portion and the acquisition portion, wherein the radio frequency portion is disabled during the acquisition of the noise magnetic resonance data;
reconstruct a series of magnetic resonance images weighted for the relaxation time using the series of magnetic resonance data; and
reconstruct a noise magnetic resonance image using the noise magnetic resonance data.

14. A method of operating a magnetic resonance imaging system, wherein the method comprises:
controlling the magnetic resonance imaging system with pulse sequence commands to acquire a series of magnetic resonance data and noise magnetic resonance data, wherein the pulse sequence commands are configured controlling the magnetic resonance imaging system to acquire the series of magnetic resonance data from a subject according to a quantitative magnetic resonance imaging protocol for quantitatively determining a relaxation time, wherein the quantitative magnetic resonance imaging protocol is configured for acquiring the series of the magnetic resonance data using multiple pulse sequence repetitions, wherein each of the multiple pulse sequence repetitions comprises a magnetic gradient portion, a radio frequency portion, and an acquisition portion, wherein the quantitative magnetic resonance imaging protocol comprises a pause cycle between at least two of the multiple pulse sequence repetitions, wherein the pulse sequence commands are configured for acquiring the noise magnetic resonance data during the pause cycle using the magnetic gradient portion and the acquisition portion, wherein the radio frequency portion is disabled during the acquisition of the noise magnetic resonance data;
reconstructing a series of magnetic resonance images weighted for the relaxation time using the series of magnetic resonance data; and
reconstructing a noise magnetic resonance image using the noise magnetic resonance data.

* * * * *